(12) United States Patent
Brinker

(10) Patent No.: US 9,897,679 B2
(45) Date of Patent: Feb. 20, 2018

(54) MAGNETIC RESONANCE SYSTEM WITH RF POWER MEASUREMENT CHECK USING A CALIBRATED TEST PULSE

(71) Applicant: Gerhard Brinker, Erlangen (DE)

(72) Inventor: Gerhard Brinker, Erlangen (DE)

(73) Assignee: Siemens Aktiengesellschaft, München (DE)

(*) Notice: Subject to any disclaimer, the term of this patent is extended or adjusted under 35 U.S.C. 154(b) by 550 days.

(21) Appl. No.: 14/615,272

(22) Filed: Feb. 5, 2015

(65) Prior Publication Data

US 2015/0219739 A1 Aug. 6, 2015

(30) Foreign Application Priority Data

Feb. 5, 2014 (DE) .................. 10 2014 202 015

(51) Int. Cl.
*G01V 3/00* (2006.01)
*G01R 33/58* (2006.01)
*G01R 33/36* (2006.01)

(52) U.S. Cl.
CPC .............. *G01R 33/58* (2013.01); *G01R 33/36* (2013.01); *G01R 33/583* (2013.01)

(58) Field of Classification Search
CPC ........ G01R 33/58; G01R 33/36; G01R 33/583
USPC ........................................... 324/309
See application file for complete search history.

(56) References Cited

U.S. PATENT DOCUMENTS 6,127,826 A * 10/2000 Thompson ....... G01R 33/56554
324/307

7,626,385 B2 * 12/2009 Yokoi ................. G06F 19/3412
324/307
9,625,541 B2 * 4/2017 Fontius ............... G01R 33/288
2004/0150401 A1 8/2004 Eberler et al.
2006/0064002 A1 * 3/2006 Grist ..................... A61B 5/015
600/410

(Continued)

FOREIGN PATENT DOCUMENTS

DE 10254660 A1 6/2004

OTHER PUBLICATIONS

German Office action for related German Application No. 10 2014 202 015.8, dated Aug. 5, 2015, with English Translation.

*Primary Examiner* — Susan Lee
(74) *Attorney, Agent, or Firm* — Lempia Summerfield Katz LLC

(57) ABSTRACT

A predetermined reference object is arranged in a scan volume of a magnetic resonance system. In the scope of adjustment measurements, the reference object is respectively exposed by a radiofrequency transmitter antenna to an adjustment pulse. Using at least one radiofrequency receiver antenna, a magnetic resonance signal excited by the respective adjustment pulse in the reference object is respectively recorded. An amplitude of a first test pulse is ascertained with the aid of the magnetic resonance signals recorded in the scope of the adjustment measurements. In the scope of a subsequent test measurement, the reference object is exposed to the first test pulse by the radiofrequency transmitter antenna. A first measurement signal dependent on the amplitude of the first test pulse is recorded during the exposure of the reference object to the first test pulse. Further measures are implemented based on the recorded first measurement signal.

15 Claims, 4 Drawing Sheets

(56) References Cited

U.S. PATENT DOCUMENTS

| | | | | |
|---|---|---|---|---|
| 2007/0145975 A1* | 6/2007 | Feiweier | ............ | G01R 33/583 |
| | | | | 324/307 |
| 2011/0109312 A1* | 5/2011 | Yamanaka | ........... | G01R 33/288 |
| | | | | 324/309 |
| 2011/0245655 A1* | 10/2011 | Abe | .................. | G01R 33/4816 |
| | | | | 600/410 |
| 2016/0377693 A1* | 12/2016 | Pednekar | ............ | G01R 33/546 |
| | | | | 324/322 |

\* cited by examiner

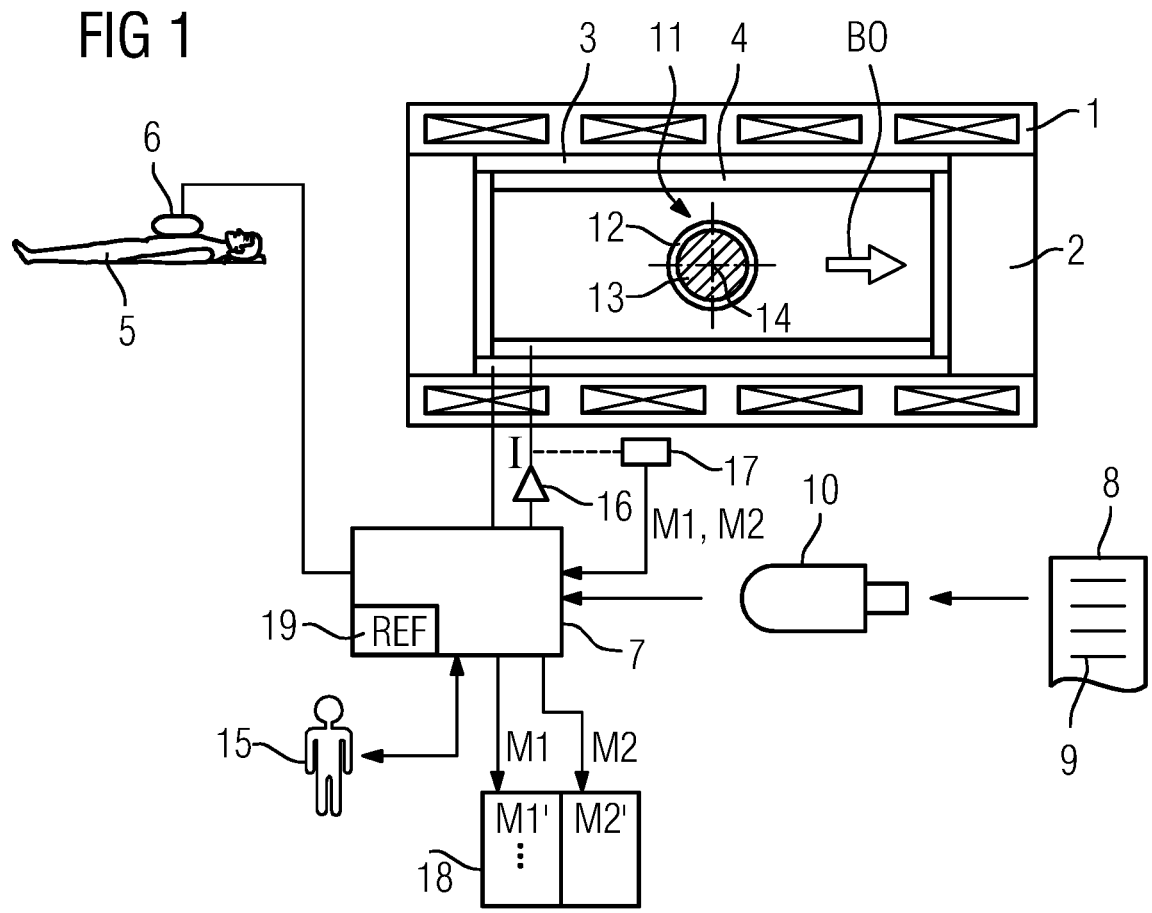

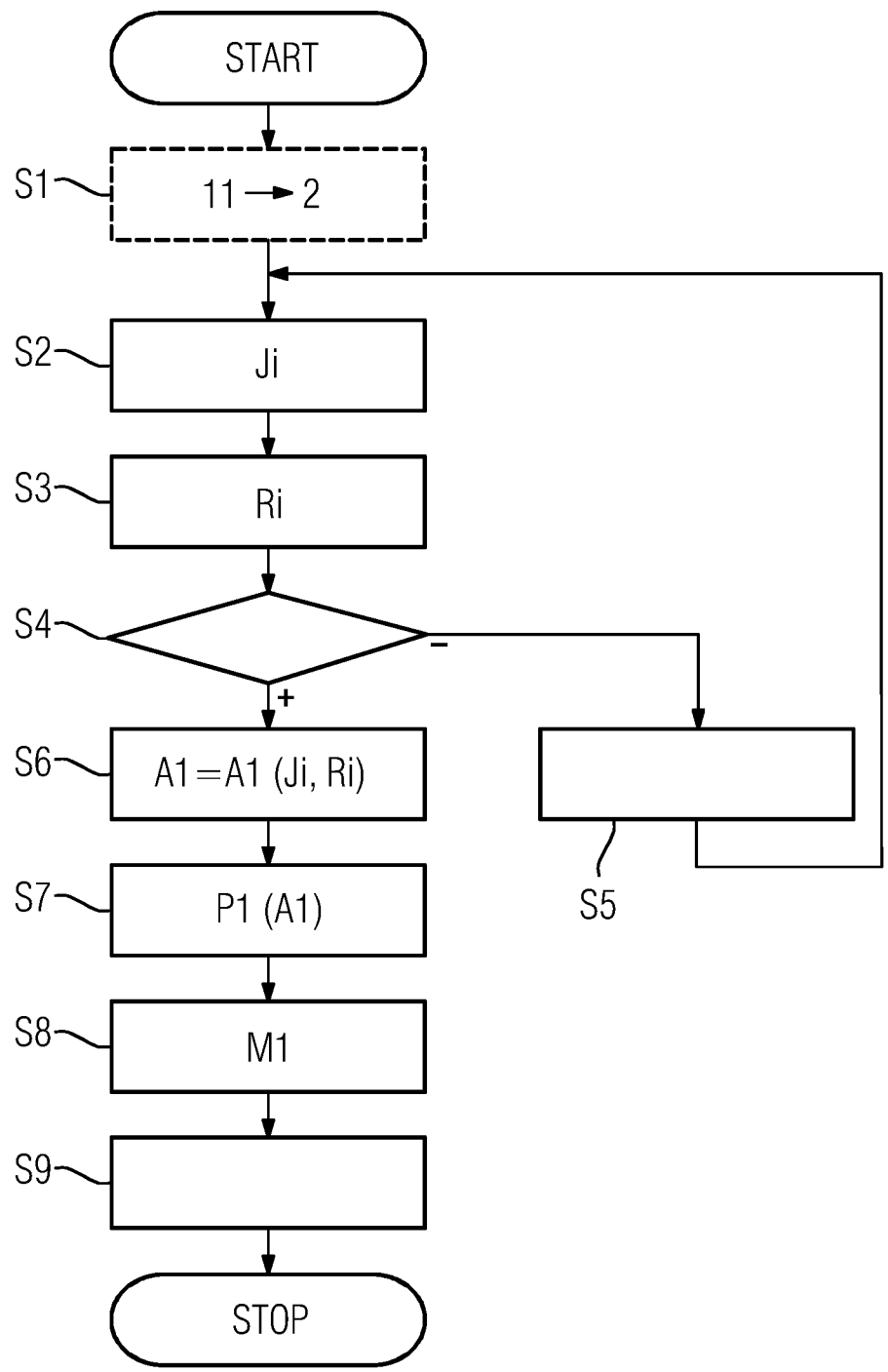

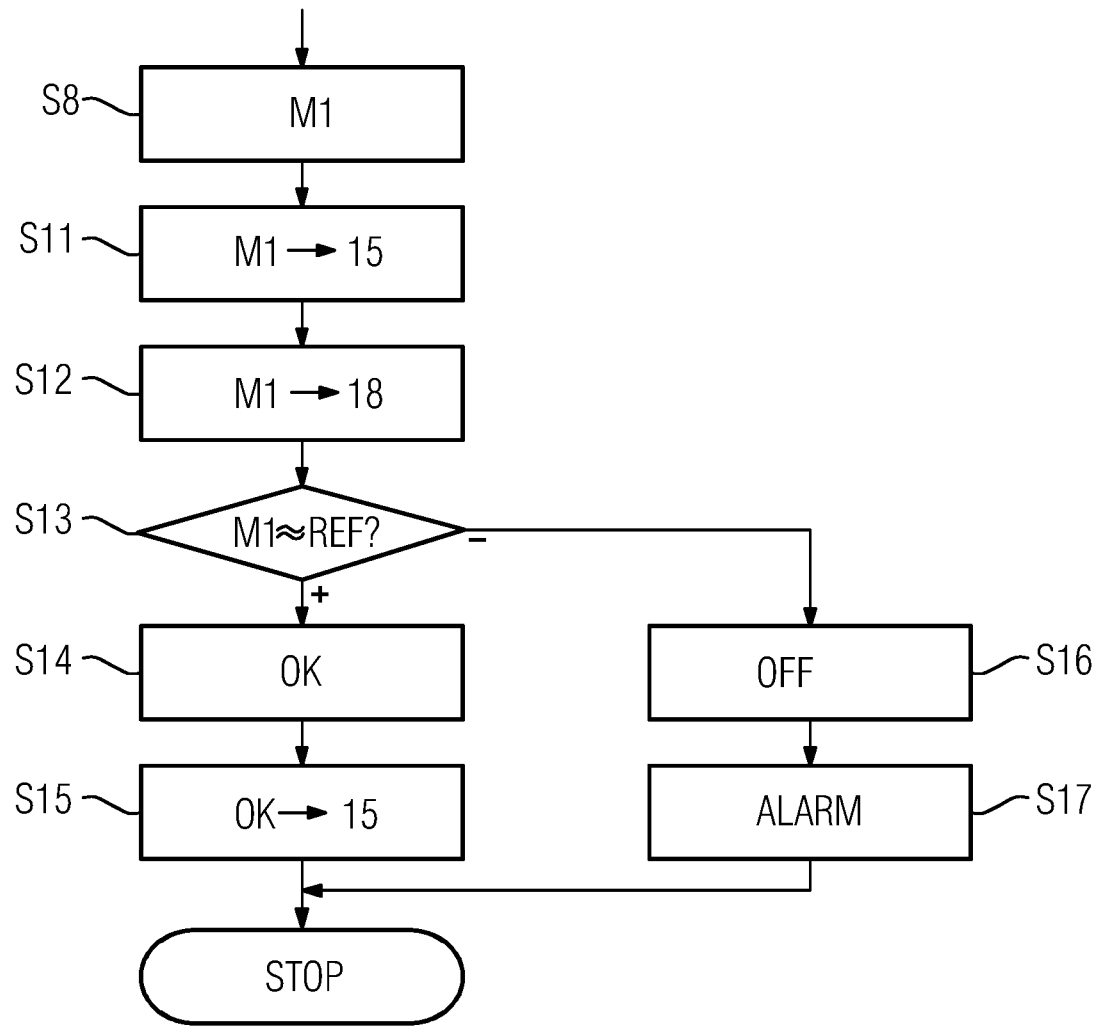

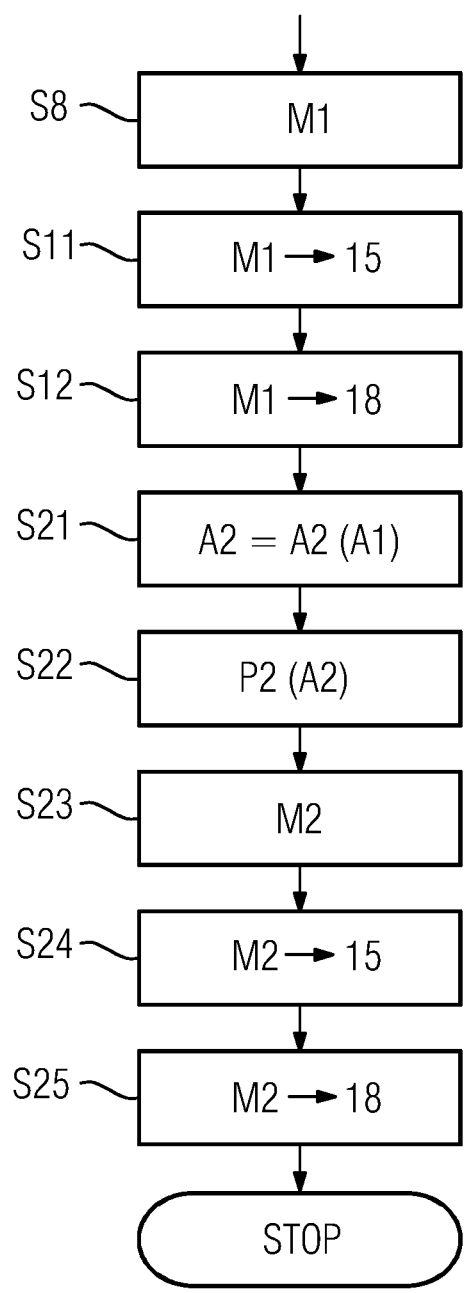

MAGNETIC RESONANCE SYSTEM WITH RF POWER MEASUREMENT CHECK USING A CALIBRATED TEST PULSE

This application claims the benefit of DE 10 2014 202 015.8, filed on Feb. 5, 2014, which is hereby incorporated by reference in its entirety.

BACKGROUND

The present embodiments relate to operating a magnetic resonance system.

In magnetic resonance tomography, various magnetic fields are provided (e.g., a base field, gradient fields and radiofrequency pulses).

Using the static base field (e.g., the B0 field), the spins of the scanned object are aligned in the direction of the base field. By the emission of a radiofrequency excitation pulse (MHz range) (e.g., the B1 field), the spins are rotated (e.g., "tilted") out of the direction of the base field into another direction. After the end of the radiofrequency excitation pulse, the nuclear spins return into the direction of the B0 field. This process induces an electrical signal in the receiver coils, which is then used for the image calculation.

The gradient fields lie in the low-frequency range (kHz range) and are locally superimposed on the base field. A separate term is not generally used for the gradient fields.

In order to be able to deflect the spins, the frequency of the excitation pulses are to be adjusted accurately to the resonant frequency determined by the strength of the B0 field. The direction of the B1 field is to be orthogonal to the direction of the B0 field. The excitation pulses are to rotate around the base field with the resonant frequency. The rotation of the B1 field of the excitation pulses may take place either in the clockwise sense or in the counterclockwise sense. Only one of the two rotation directions (e.g., the rotation direction that coincides with the rotation direction of the nuclear spins around the B0 field) is effective for the deflection. This direction is denoted by the suffix "+". The other is correspondingly denoted by the suffix "−". With respect to the imaging, the B1+ component of the B1 field is thus referred to. For technical reasons, however, a pure B1+ field may be generated only with difficulty. For a small oil-filled sphere, this situation is generally quite sufficient, while the geometry and inhomogeneous structure of a patient almost always also leads to a more or less sizeable B1− component.

Various scanned objects do not react in entirely the same way to exactly the same excitation pulses. Before imaging measurement sequences with corresponding excitation pulses are started, the way in which the radiofrequency amplifier is to be driven so that the desired B1+ amplitudes are generated in the scanned object is to be ascertain. This is done by "transmitter adjustment", which may be interpreted as an "amplifier adjustment procedure". This procedure is carried out as follows.

Beginning with an appropriate (e.g., approximately correct) starting amplitude based on empirical values, a particular number of radiofrequency excitation pulses are transmitted. The amplitude profile and time spacing of the radiofrequency excitation pulses are exactly defined. The magnetic resonance signal excited by the excitation pulses is determined in terms of the B1+ amplitude achieved. If this amplitude differs by more than a predetermined tolerance from a reference amplitude to be adjusted, the driving of the radiofrequency amplifier is then modified according to the difference ascertained. The measurement procedure described above is then repeated until the amplitude obtained lies in the acceptable tolerance range. In general, a few such iterations are provided in order to ascertain the correct driving of the radiofrequency amplifier for a given situation (e.g., scanned object, transmitter coil and position of the scanned object relative to the transmitter coil).

By the emission of the radiofrequency excitation pulse, power is developed in the hardware of the transmission path (e.g., including the transmitter coil), but also in the scanned object. This power is to be determined and monitored by measurement technology. The monitoring is provided in order to protect the hardware itself against arcing and overheating. The monitoring is provided in order to protect the patient against burns and overloading of the circulation. Magnetic resonance systems are equipped with corresponding measuring apparatuses. The measuring apparatuses provide safe operation of the magnetic resonance system at any time. The measuring apparatuses are configured so that the measuring apparatuses are intrinsically safe. This provides that a single error cannot lead to failure of the measuring apparatuses as a whole. The measuring apparatuses are to be checked at sufficiently short time intervals (e.g., once a month) in order to provide that the measuring apparatuses are still operating correctly.

In order to provide correct operation of the respective measuring apparatus, various measures may be provided. For example, a technician may check the measuring apparatus at sufficiently short time intervals on site by using a suitable external measuring device, and/or the measuring apparatus, even if still functioning properly, may be constantly replaced with a new, correctly operating measuring apparatus. This procedure entails personnel costs and material costs.

As an alternative, a hardware-based solution may be provided. In this case, the measuring apparatus includes a plurality of subdevices that independently of one another monitor the radiofrequency power delivered to the scanned object, and also monitor one another. This procedure makes the measuring apparatus more complicated and more expensive.

One particular critical error is a slow drift of the measuring apparatus (e.g., not full failure of the measuring apparatus but gradual loss of the calibration). In the case of a plurality of measuring apparatuses, all the measuring apparatuses are not to drift simultaneously in the same direction.

SUMMARY AND DESCRIPTION

The scope of the present invention is defined solely by the appended claims and is not affected to any degree by the statements within this summary.

The present embodiments may obviate one or more of the drawbacks or limitations in the related art. For example, reliable operation of a magnetic resonance system provided in a simple, economical and reliable way is provided.

According to one or more of the present embodiments, an operating method includes arranging a predetermined reference object in a scan volume of the magnetic resonance system. In the scope of adjustment measurements, the reference object is respectively exposed to an adjustment pulse using a radiofrequency transmitter antenna of the magnetic resonance system. Using at least one radiofrequency receiver antenna of the magnetic resonance system, a magnetic resonance signal excited by the respective adjustment pulse in the reference object is respectively recorded. An amplitude of a first test pulse is ascertained with the aid of the magnetic resonance signals recorded in the scope of the adjustment measurements. In the scope of a subsequent test measurement, the reference object is exposed to the first test pulse using the radiofrequency transmitter antenna. A first measurement signal dependent on the amplitude of the first test pulse is recorded by a measuring apparatus during the exposure of the reference object to the first test pulse. Further measures are implemented based on the recorded first measurement signal.

Both the adjustment pulses and the first test pulse are excitation pulses, by which the reference object is excited to emit magnetic resonance signals.

One or more of the present embodiments are based on the discovery that, in the same magnetic resonance system, although different amplitudes of the excitation pulses are provided from object to object for appropriate excitation of objects to emit magnetic resonance signals, with an identical measurement situation (e.g., same transmitter coil, same scanned object, positioning of the scanned object relative to the transmitter coil), the amplitude for the same object nevertheless is or should be the same. If the same reference object is now introduced into the scan volume at time spacings, the amplitude of the first test pulse may also always be the same. If the measuring apparatus is functioning properly, the measuring apparatus may therefore always deliver at least approximately the same first measurement signal when the reference object is exposed to the first test pulse. If this is not the case, a defect has occurred in the generation of the first test pulse and/or in the measuring apparatus.

In other words, the B1+ amplitude of the received magnetic resonance signal is recorded and compared with a reference amplitude. The adjustment pulses are varied until the B1+ amplitude of the received magnetic resonance signal coincides with the reference amplitude. When this is the case, if all components are functioning properly, the first measurement signal recorded by the measuring apparatus is to have the same reference value. If this is not the case, there is an error. In such a case, the particular error is be ascertained and removed (e.g., by a service technician).

The reference value may be measured in the scope of the first use of the magnetic resonance system in a one-off calibration measurement, and stored in a memory of the magnetic resonance system.

The first measurement signal may, for example, be determined in any desired way. For example, the transmission power directed forward and back may be recorded at the terminals of the coil, and the difference between the terminals of the coil may be calculated. Use of the driving amplitude of the radiofrequency amplifier may, if nothing is changed, naturally also be identical. This quantity, however, may not be used for detecting an error of the measuring apparatus or of another component, since the quantity is, for example, not significant either for the application (e.g., the measurement sequence to be carried out) or for safety if the gain of the radiofrequency amplifier drifts a little in the course of time (and therefore the correlation of the safety-critical transmission power delivered to the coil system or the transmission power along the transmission path (component protection) is lost). An element of the transmission chain may also have been replaced with one that has a different attenuation value. This also is not significant for the application so long as the radiofrequency amplifier is capable of generating the specified B1+ amplitudes.

The reference B1+ field (as described above) is respectively set up by the received magnetic resonance signal during test measurements at later times.

In the scope of the adjustment pulses, the measuring apparatus may be used to record a signal that is dependent on the amplitude of the respective adjustment pulse. In this way, if one of the adjustment pulses by chance has the correct amplitude, this adjustment pulse may be used instead of the first test pulse. For monitoring purposes, the magnetic resonance signal excited in the reference object may be recorded and evaluated for the first test pulse. These two measures are, however, only optional. In the simplest case, the recorded first measurement signal is merely output to an operator of the magnetic resonance system. The output may, for example, take place via a display device.

Based on the task, the operator may then react suitably. In the scope of the first test pulse, the operator of the magnetic resonance system may be a service technician or a similar person.

The recorded first measurement signal may be stored in a memory of the magnetic resonance system in addition to already stored first measurement signals. This procedure provides uninterrupted documentation of the correct or incorrect function of the measuring apparatus in the sense of a chronological history.

In one embodiment, the recorded first measurement signal is compared with a reference value stored in a memory of the magnetic resonance system. In this case, further measures may be implemented as a function of the comparison. The reference value may, for example, be ascertained experimentally in the scope of the production and first use of the magnetic resonance system, or the reference value may be determined as a type-specific reference value. In the former case, reproducibility with a small tolerance may be provided.

For example, in the event that the recorded first measurement signal lies within a tolerance range around a reference value, further operation of the magnetic resonance system is enabled with or without output of an enabling message to the operator of the magnetic resonance system. In the event that the recorded first measurement signal does not lie within the tolerance range around the reference value, conversely, further operation of the magnetic resonance system is blocked, and/or an alarm message is output to the operator of the magnetic resonance system. For example, the operator may be prompted to check the measuring apparatus.

By virtue of the fact that, assuming correct functioning of the magnetic resonance system, including the measuring apparatus, the amplitude of the first test pulse is known, even more extensive calibration of the measuring apparatus is possible. Based on the amplitude of the first test pulse, for at least one second test pulse, the amplitude of the at least one second test pulse is ascertained, the reference object is exposed to the second test pulse using the radiofrequency transmitter antenna, and a second measurement signal dependent on the amplitude of the second test pulse is recorded using the measuring apparatus during the exposure of the reference object to the second test pulse. The second measurement signal may, for example, be output to the operator of the magnetic resonance system and/or stored in a memory of the magnetic resonance system in addition to already stored second measurement signals. The output may, in a similar way to the first measurement signal, take place via a display device.

The number of second test pulses may be determined according to requirements. In the case of this configuration, at least one single second test pulse is provided. A plurality of second test pulses may, however, also be provided. For example, a complete calibration curve may be recorded and optionally stored. By this procedure, for example, the linearity of the measuring apparatus may be checked.

The amplitude of the first test pulse may be reported, and optionally, the amplitudes of the second test pulses may also be reported via a computer/computer connection to a device outside the magnetic resonance system. In this way, for example, evaluation may be carried out in an external service facility.

In one embodiment, the reference object is arranged at a predetermined position inside the scan volume. In this way, the reproducibility of the amplitude of the first test pulse, and therefore of the first measurement signal, is increased. The reference object may, for example, be arranged at the isocenter of the scan volume.

The reference object may be formed according to requirements. The reference object may be formed as a sphere. As an alternative or in addition to formation as a sphere, the reference object may have a shell that is filled with oil. Such a reference object (e.g., phantom) may be available.

A computer program is also provided. The computer program may be stored in a non-transitory computer-readable storage medium and includes instructions. According to one or more of the present embodiments, the execution of the instructions of machine code of the computer program by the control device causes the control device to, in the scope of adjustment measurements, respectively expose a predetermined reference object arranged in a scan volume of the magnetic resonance system to an adjustment pulse using a radiofrequency transmitter antenna of the magnetic resonance system, and respectively record, using at least one radiofrequency receiver antenna of the magnetic resonance system, a magnetic resonance signal excited in the reference object using the respective adjustment pulse. An amplitude of a first test pulse is ascertained with the aid of the magnetic resonance signals recorded in the scope of the adjustment measurements. The reference object is exposed to the first test pulse using the radiofrequency transmitter antenna in the scope of a subsequent test measurement. A first measurement signal dependent on the amplitude of the first test pulse is recorded using a measuring apparatus during the exposure of the reference object to the first test pulse. The first measurement signal is recorded in a memory of the magnetic resonance system in addition to already stored first measurement signals, and/or the recorded first measurement signal is compared with a reference value stored in the memory of the magnetic resonance system or another memory of the magnetic resonance system. Further measures are implemented as a function of the comparison.

In a similar way to the corresponding configuration of the operating method, in the event that the recorded first measurement signal lies within a tolerance range around a reference value, the execution of the machine code by the control device causes the control device to enable further operation of the magnetic resonance system with or without output of an enabling message to the operator of the magnetic resonance system. In the event that the recorded first measurement signal does not lie within the tolerance range around the reference value, the execution of the machine code may cause the control device to block further operation of the magnetic resonance system. As an alternative or in addition, the execution of the machine code may cause the control device to output an alarm message to the operator of the magnetic resonance system.

In a similar way to the corresponding configuration of the operating method, the execution of the machine code by the control device also causes the control device, based on the amplitude of the first test pulse, for at least one second test pulse, to ascertain the amplitude of the at least one second test pulse. The reference object is exposed to the second test pulse using the radiofrequency transmitter antenna, and a second measurement signal dependent on the amplitude of the second test pulse is recorded using the measuring apparatus during the exposure of the reference object to the second test pulse. The second measurement signal is output to the operator of the magnetic resonance system, and/or the second measurement signal is stored in a memory of the magnetic resonance system in addition to already stored second measurement signals.

A control device is also provided. According to one or more of the present embodiments, the control device is programmed with a computer program according to one or more of the present embodiments.

A magnetic resonance system is provided. According to one or more of the present embodiments, the control device is formed according to one or more of the present embodiments.

BRIEF DESCRIPTION OF THE DRAWINGS

FIG. 1 shows one embodiment of a magnetic resonance system; and

FIGS. 2 to 4 show flowcharts of exemplary methods.

DETAILED DESCRIPTION

According to FIG. 1, one embodiment of a magnetic resonance system has a base magnet 1. The base magnet 1 generates a temporally static, locally essentially homogeneous base magnetic field B0 in a scan volume 2. The base magnet 1 may, for example, be formed as a superconducting magnet.

The magnetic resonance system also includes a gradient system 3. The gradient system 3 generates gradient fields that are superimposed on the base magnetic field B0. Using the gradient system 3, or the gradient fields, encoding of the magnetic resonance signals takes place in position space and/or in frequency space.

The magnetic resonance system also includes at least one radiofrequency transmitter antenna 4. Using the radiofrequency transmitter antenna 4, a scanned object 5 arranged in the scan volume 2 (e.g., in the scope of normal scans, often a person) may be excited to emit magnetic resonance signals. Using the radiofrequency transmitter antenna 4 or a separate radiofrequency receiver antenna 6, the excited magnetic resonance signals may be received. If the radiofrequency transmitter antenna 4 is used to receive excited magnetic resonance signals, the radiofrequency transmitter antenna 4 is formed as a transmitter/receiver antenna.

The magnetic resonance system also includes a control device 7. The control device 7 is used to drive at least the gradient system 3 and the radiofrequency antennas 4, 6. The control device 7 is formed as a software-programmable control device. The control device 7 is programmed with a computer program 8.

The computer program 8 includes machine code 9 that may be executed by the control device 7. The execution of the machine code 9 by the control device 7 causes the control device 7 to carry out an operating method according to one or more of the present embodiments. The programming of the control device 7 with the computer program 8 therefore provides that the control device 7 is formed correspondingly. The operating method will be explained in more detail below in connection with FIG. 2.

The computer program 8 may be supplied to the control device 7 in any desired way. Purely by way of example, FIG. 1 shows a data medium 10 on which the computer program 8 may be stored in machine-readable form (e.g., in electronic form). The representation of the data medium 10 as a USB memory stick is, however, purely exemplary. The data medium 10 may also be formed in another way.

In the scope of the operating method according to one or more of the present embodiments, according to FIGS. 1 and 2, a predetermined reference object 11 is first arranged in the scan volume 2 in act S1. The reference object 11 may be formed according to requirements. For example, the reference object 11 may be formed as a sphere in accordance with the representation in FIG. 1. The reference object 11, regardless of whether or not the reference object 11 is formed as a sphere, may also have a shell 12 that is filled with oil 13. The reference object 11 may be arranged at a predetermined position 14 inside the scan volume 2. This position may, for example, be the isocenter of the scan volume 2. Act S1 may be carried out in an automated fashion by the control device 7. As an alternative, act S1 may be carried out manually by an operator 15 of the magnetic resonance system. For this reason, act S1 is only represented in dashes in FIG. 2.

Next, in acts S2 to S5, a number of adjustment measurements are carried out. In the scope of the adjustment measurements, the reference object 11 is exposed in act S2, respectively, to an adjustment pulse Ji using the radiofrequency transmitter antenna 4. The radiofrequency transmitter antenna 4 is driven by the control device 7 via a radiofrequency power amplifier 16. If necessary, the gradient system 3 in this case is exposed to a gradient current in a manner known per se. Using at least one radiofrequency receiver antenna 4, 6 of the magnetic resonance system (e.g., either the radiofrequency transmitter antenna 4 or another radiofrequency antenna 6 of the magnetic resonance system) in act S3, a corresponding excited magnetic resonance signal Ri is recorded by the control device 7. The adjustment pulses Ji may have different amplitudes to one another and/or different durations to one another. Optionally, a measurement signal may already be recorded by a measuring apparatus 17 in the scope of an act immediately following act S3.

In act S4, the control device 7 checks whether the adjustment measurements are completed. If this is not the case, the control device 7 returns to act S2 via act S5. In act S5, for example, another not yet used adjustment pulse Ji with a different amplitude and/or duration may be selected or determined by the control device 7. Otherwise, the control device 7 continues to act S6.

In act S6, with the aid of the magnetic resonance signals Ri recorded in the scope of the adjustment measurements, optionally in conjunction with the amplitudes and durations of the adjustment pulses Ji, the control device 7 ascertains (e.g., determines) an amplitude A1 of a first test pulse P1. Then, in act S7, the control device 7 outputs the first test pulse P1, with the corresponding amplitude A1, via the radiofrequency power amplifier 16 to the radiofrequency transmitter antenna 4. Therefore, in act S7, the reference object 11 is exposed to the first test pulse P1 by the radiofrequency transmitter antenna 4 in the scope of a test measurement following the adjustment measurements.

During the exposure of the reference object 11 to the first test pulse P1, in act S8, the control device 7 records a first measurement signal M1 using a measuring apparatus 17. The first measurement signal M1 depends on the amplitude A1 of the first test pulse P1. For example, according to the representation in FIG. 1, the amplitude of a radiofrequency current I, which is applied to the radiofrequency transmitter antenna 4, may be recorded as the first measurement signal M1. In order to record the current, for example, pickup coils may be placed in the vicinity of the radiofrequency transmitter antenna 4. In one embodiment, however, the transmission power directed forward and back is determined by directional couplers that may be arranged near the coil terminals. The difference between the two transmission powers gives the transmission power delivered to the radiofrequency transmitter antenna 4. As an alternative, for example, using the radiofrequency transmitter antenna 6, the amplitude of a signal induced by the radiofrequency transmitter antenna 4 in the radiofrequency receiver antenna 6 may be recorded as the first measurement signal M1.

In act S9, the control device 7 implements further measures. The further measures are based on the recorded first measurement signal M1.

Some of the possible further measures will be explained in more detail below in connection with FIG. 3. FIG. 3 thus shows possible configurations of act S9 of FIG. 2. The further measures represented in FIG. 3 are carried out cumulatively therein. They may, however, be carried out independently of one another.

According to FIG. 3, the recorded first measurement signal M1 is output by the control device 7 to the operator 15 of the magnetic resonance system in act S11. The output may, for example, be carried out via a display device, not represented in FIG. 3 (e.g., a monitor).

As an alternative or in addition, the control device 7 may store the recorded first measurement signal M1 in act S12 in a memory 18 of the magnetic resonance system in addition to already stored first measurement signals M1'. The storing may be carried out in conjunction with a timestamp. The first measurement signals M1' already stored in the memory 18 come from previous test measurements. A timestamp may be assigned to these as well. Both the already stored first measurement signals M4' and the newly stored first measurement signal M1 may, optionally together with a respective timestamp, be read out from the memory 18. A history of first measurement signals M1, M1' is therefore available if necessary.

As an alternative or in addition, the control device 7 may compare the recorded first measurement signal M1 in act S13 with a reference value REF stored in a memory 18, 19 of the magnetic resonance system. The memory 19 may either be the memory 18 or another memory 19. Further measures are implemented as a function of the comparison. Possible further measures will be explained in more detail below in connection with acts S14 to S17.

In the scope of act S13, the control device 7 checks, for example, whether the recorded first measurement signal M1 lies within a predetermined tolerance range around the reference value REF. The tolerance range may be determined suitably, and be defined, for example, as a percentage of the reference value REF. The percentage may, for example, lie between 5% and 20%. For example, larger or smaller values may also be possible.

If the recorded first measurement signal M1 lies within the predetermined tolerance range around the reference value REF, the control device 7 may, for example, proceed to act S14. In act S14, the control device 7 enables further operation of the magnetic resonance system. Optionally, there may in addition be act S15. In act S15, the control device 7 outputs an enabling message to the operator 15 of the magnetic resonance system.

If, however, the recorded first measurement signal M1 does not lie within the predetermined tolerance range around the reference value REF, the control device 7 may, for example, proceed to act S16. In act S16, the control device 7 blocks further operation of the magnetic resonance system. As an alternative or in addition to act S16, the control device 7 may carry out act S17. In act S17, the control device 7 outputs an alarm message to the operator 15 of the magnetic resonance system.

As an alternative or in addition to the configurations according to FIG. 3, act S9 may be configured in a way that will be explained in more detail below in connection with FIG. 4. If the configuration according to FIG. 4 is combined with the configuration according to FIG. 3, acts S21 to S25 may be implemented in the YES branch of FIG. 3. This, however, is not necessarily required.

According to FIG. 4, there are also, in a similar way to FIG. 3, acts S11 and S12. These, however, are not necessarily required. As an alternative, acts S11 and S12 may be omitted.

According to FIG. 4, in act S21, based on the amplitude A1 of the first test pulse P1, for a second test pulse P2, the control device 7 determines the amplitude A2 of the second test pulse P2. For example, in act S21, the control device 7 may scale the amplitude A1 of the first test pulse P1 with a predetermined scaling factor. In act S22, the control device 7 exposes the reference object 11 to the second test pulse P2 using the radiofrequency transmitter antenna 4. During the exposure of the reference object 11 to the second test pulse P2, in act S23, the control device 7 records a second measurement signal M2 dependent on the amplitude A2 of the second test pulse P2 using the measuring apparatus 17. Acts S21, S22 and S23 may optionally be carried out repeatedly with different values for the respective amplitude A2 of the respective second test pulse P2.

Based on act S23, the control device 7 may carry out act S24. In act S24, the control device 7 outputs the second measurement signal M2 recorded in act S23 to the operator 15 of the magnetic resonance system. If acts S21 to S23 are carried out repeatedly, act S24 may be incorporated into the sequence of acts S21 to S23. As an alternative, act S24 may be carried out after repeated conduct of acts S21 to S23. In this case, in the scope of the repeated conduct of acts S21 to S23, the respectively recorded second measurement signals M2 are output together to the operator 15 of the magnetic resonance system during the (single) conduct of act S24.

As an alternative or in addition to act S24, the control device 7 may carry out act S25. In act S25, the control device 7 stores the second measurement signal M2 recorded in act S23 in addition to already stored second measurement signals M2' in the memory 18 of the magnetic resonance system. In a similar way to act S24, act S25 may either be incorporated into the sequence of acts S21 to S23, or act 25 may be carried out after optionally repeated conduct of acts S21 to S23.

Act S25 may be present only when act S12 is also present. Act S24, however, may be carried out independently of the presence of act S12.

In the scope of acts S21 to S25, it is also possible to check whether the recorded second measurement signals M2 vary in an acceptable range. Optionally, measures that are similar to those that are implemented in relation to the recorded first measurement signal M1 may be implemented.

In one embodiment, a predetermined reference object 11 is arranged in a scan volume 2 of a magnetic resonance system. In the scope of adjustment measurements, the reference object 11 is respectively exposed to an adjustment pulse Ji using a radiofrequency transmitter antenna 4 of the magnetic resonance system. Using at least one radiofrequency receiver antenna 4, 6 of the magnetic resonance system, a magnetic resonance signal Ri excited by the respective adjustment pulse Ji in the reference object 11 is respectively recorded. An amplitude A1 of a first test pulse P1 is ascertained with the aid of the magnetic resonance signals Ri recorded in the scope of the adjustment measurements. In the scope of a subsequent test measurement, the reference object 11 is exposed to the first test pulse P1 by the radiofrequency transmitter antenna 4. A first measurement signal M1 dependent on the amplitude A1 of the first test pulse P1 is recorded by a measuring apparatus 17 during the exposure of the reference object 11 to the first test pulse P1. Further measures are implemented based on the recorded first measurement signal M1.

The present embodiments may many advantages. For example, rapid and reliable checking of the measuring apparatus may be carried out at almost any time without additional outlay, or with negligible additional outlay. The reference object 11 is to be arranged in the scan volume 2, and the Adjust Transmission (AdjTra) routine is to be called up, which is generally known in magnetic resonance systems.

Although the invention has been illustrated and described in more detail by the exemplary embodiments, the invention is not restricted to the examples disclosed. Other variants may be derived therefrom by the person skilled in the art without departing from the protective scope of the invention.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for operating a magnetic resonance system, the method comprising:
    arranging a predetermined reference object in a scan volume of the magnetic resonance system;
    exposing, in the scope of adjustment measurements, the predetermined reference object to an adjustment pulse, respectively, using a radiofrequency transmitter antenna of the magnetic resonance system;
    recording a magnetic resonance signal excited by the adjustment pulse in the predetermined reference object, respectively using at least one radiofrequency receiver antenna of the magnetic resonance system;
    determining an amplitude of a first test pulse with the magnetic resonance signals recorded in the scope of the adjustment measurements;
    exposing the reference object to the first test pulse using the radiofrequency transmitter antenna in the scope of a subsequent test measurement;

recording a first measurement signal dependent on the amplitude of the first test pulse using a measuring apparatus during the exposure of the reference object to the first test pulse; and implementing further measures based on the recorded first measurement signal.

2. The method of claim 1, further comprising outputting the recorded first measurement signal to an operator of the magnetic resonance system.

3. The method of claim 1, further comprising storing the recorded first measurement signal in a memory of the magnetic resonance system in addition to already stored first measurement signals.

4. The method of claim 1, further comprising:
comparing the recorded first measurement signal with a reference value stored in a memory of the magnetic resonance system; and
implementing further measures as a function of the comparison.

5. The method of claim 4, wherein in the event that the recorded first measurement signal lies within a tolerance range around a reference value, further operation of the magnetic resonance system is enabled with or without output of an enabling message to an operator of the magnetic resonance system, and
wherein in the event that the recorded first measurement signal does not lie within the tolerance range around the reference value, further operation of the magnetic resonance system is blocked, an alarm message is output to the operator of the magnetic resonance system, or a combination thereof.

6. The method of claim 1, further comprising:
determining an amplitude of at least one second test pulse based on the amplitude of the first test pulse;
exposing the reference object to the second test pulse using the radiofrequency transmitter antenna;
recording a second measurement signal dependent on the amplitude of the second test pulse using the measuring apparatus during the exposure of the reference object to the second test pulse; and
outputting the second measurement signal to the operator of the magnetic resonance system, storing the second measurement signal in a memory of the magnetic resonance system in addition to already stored second measurement signals, or a combination thereof.

7. The method of claim 1, wherein the reference object is arranged at a predetermined position inside the scan volume.

8. The method of claim 7, wherein the reference object is arranged at an isocenter of the scan volume.

9. The method of claim 1, wherein the reference object is formed as a sphere.

10. The method of claim 1, wherein the reference object has a shell that is filled with oil.

11. In a non-transitory computer-readable storage medium storing machine code having instructions executable by a controller for a magnetic resonance system for operating a magnetic resonance system, the instructions comprising:
exposing, in the scope of adjustment measurements, a predetermined reference object arranged in a scan volume of the magnetic resonance system to an adjustment pulse, respectively, using a radiofrequency transmitter antenna of the magnetic resonance system;
recording, by at least one radiofrequency receiver antenna of the magnetic resonance system, a magnetic resonance signal excited in the reference object, respectively, using the respective adjustment pulse;

determining an amplitude of a first test pulse with the aid of the magnetic resonance signals recorded in the scope of the adjustment measurements;
exposing the reference object to the first test pulse using the radiofrequency transmitter antenna in the scope of a subsequent test measurement;
recording a first measurement signal dependent on the amplitude of the first test pulse using a measuring apparatus during the exposure of the reference object to the first test pulse;
storing the recorded first measurement signal in a memory of the magnetic resonance system in addition to already stored first measurement signals, comparing the recorded first measurement signal with a reference value stored in the memory of the magnetic resonance system or another memory of the magnetic resonance system, or a combination thereof; and
implementing further measures as a function of the comparison if the recorded first measurement signal is compared with the reference value stored in the memory of the other memory.

12. The non-transitory computer-readable storage medium of claim 11, wherein the instructions further comprise:
in the event that the recorded first measurement signal lies within a tolerance range around the reference value, enabling further operation of the magnetic resonance system with or without output of an enabling message to an operator of the magnetic resonance system; and
in the event that the recorded first measurement signal does not lie within the tolerance range around the reference value, blocking further operation of the magnetic resonance system, outputting an alarm message to the operator of the magnetic resonance system, or a combination thereof.

13. The non-transitory computer-readable storage medium of claim 11, wherein the instructions further comprise:
based on the amplitude of the first test pulse, for at least one second test pulse, determining the amplitude of the at least one second test pulse;
exposing the reference object to the second test pulse using the radiofrequency transmitter antenna;
recording a second measurement signal dependent on the amplitude of the second test pulse using the measuring apparatus during the exposure of the reference object to the second test pulse; and
outputting the second measurement signal to the operator of the magnetic resonance system, storing the second measurement signal in a memory of the magnetic resonance system in addition to already stored second measurement signals, or a combination thereof.

14. A control device for a magnetic resonance system, the control device comprising:
a processor configured to control the magnetic resonance system to:
expose, in the scope of adjustment measurements, a predetermined reference object arranged in a scan volume of the magnetic resonance system to an adjustment pulse, respectively, using a radiofrequency transmitter antenna of the magnetic resonance system;
record, by at least one radiofrequency receiver antenna of the magnetic resonance system, a magnetic resonance signal excited in the reference object, respectively, using the respective adjustment pulse;

determine an amplitude of a first test pulse with the magnetic resonance signals recorded in the scope of the adjustment measurements;

expose the reference object to the first test pulse using the radiofrequency transmitter antenna in the scope of a subsequent test measurement;

record a first measurement signal dependent on the amplitude of the first test pulse using a measuring apparatus during the exposure of the reference object to the first test pulse; and store the recorded first measurement signal in a memory of the magnetic resonance system in addition to already stored first measurement signals, compare the recorded first measurement signal with a reference value stored in the memory of the magnetic resonance system or another memory of the magnetic resonance system, or a combination thereof; and implement further measures as a function of the comparison if the recorded first measurement signal is compared with the reference value stored in the memory or the other memory.

15. A magnetic resonance system comprising:
a base magnet;
a gradient system;
a memory;
at least one radiofrequency transmitter antenna;
at least one radiofrequency receiver antenna;
a measuring apparatus; and
a controller configured to control the magnetic resonance system to:

expose, in the scope of adjustment measurements, a predetermined reference object arranged in a scan volume of the magnetic resonance system to an adjustment pulse, respectively, using the at least one radiofrequency transmitter antenna;

record, by the at least one radiofrequency receiver antenna, a magnetic resonance signal excited in the reference object, respectively, using the respective adjustment pulse;

determine an amplitude of a first test pulse with the aid of the magnetic resonance signals recorded in the scope of the adjustment measurements;

expose the reference object to the first test pulse using the at least one radiofrequency transmitter antenna in the scope of a subsequent test measurement;

record a first measurement signal dependent on the amplitude of the first test pulse using the measuring apparatus during the exposure of the reference object to the first test pulse; and store the recorded first measurement signal in the memory in addition to already stored first measurement signals, compare the recorded first measurement signal with a reference value stored in the memory or another memory of the magnetic resonance system, or a combination thereof; and implement further measures as a function of the comparison if the recorded first measurement signal compared with the reference value stored in the memory or the other memory.

* * * * *